(12) United States Patent
Teramoto et al.

(10) Patent No.: US 8,581,758 B2
(45) Date of Patent: Nov. 12, 2013

(54) SEMICONDUCTOR DEVICE, METHOD FOR CONTROLLING THE SAME, AND DATA PROCESSING SYSTEM INCLUDING SEMICONDUCTOR DEVICE

(75) Inventors: Yuki Teramoto, Tokyo (JP); Yoshinori Haraguchi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 518 days.

(21) Appl. No.: 12/943,576

(22) Filed: Nov. 10, 2010

(65) Prior Publication Data
US 2011/0115543 A1   May 19, 2011

(30) Foreign Application Priority Data
Nov. 13, 2009   (JP) ................................. 2009-260456

(51) Int. Cl.
*H03M 9/00*   (2006.01)
(52) U.S. Cl.
USPC ......................................... 341/101; 327/408
(58) Field of Classification Search
USPC ................... 341/101, 100; 327/407, 408, 415
See application file for complete search history.

(56) References Cited

U.S. PATENT DOCUMENTS 5,721,545 A * 2/1998 Poplevine ..................... 341/100
6,335,889 B1   1/2002 Onodera 2002/0057614 A1* 5/2002 Kanazashi ..................... 365/219
2007/0024476 A1* 2/2007 Saeki et al. ..................... 341/101
2009/0219764 A1   9/2009 Shin et al.

FOREIGN PATENT DOCUMENTS

| JP | 08340259 A | * 12/1996 |
| JP | 2001-118382 | 4/2001 |
| JP | 2009-211800 | 9/2009 |

* cited by examiner

*Primary Examiner* — Howard Williams
(74) *Attorney, Agent, or Firm* — Morrison & Foerster LLP

(57) ABSTRACT

A semiconductor device includes a multiplexer and an output buffer. The multiplexer includes: n switches (n is an integer of 2 or greater) each including an input node receiving a different data signal and an output node coupled to an input node of the output buffer; and a plurality of switch control circuits each corresponding to a respective one of the n switches. Each of the plurality of switch control circuits turns on a corresponding one of the n switches based on a corresponding one of the signals each having a first cycle and a phase different by 1/n of the cycle from adjacent phases. When each of the plurality of switch control circuits detects that an input-side data signal of the corresponding one of the n switches appears at a corresponding output-side node, each of the plurality of switch control circuits turns off the corresponding switch. The multiplexer converts data, which is inputted in parallel to the n switches and which changes in the first cycle, into serial data that changes in 1/n of the first cycle and outputs the serial data via the output buffer.

27 Claims, 8 Drawing Sheets

SEMICONDUCTOR DEVICE, METHOD FOR CONTROLLING THE SAME, AND DATA PROCESSING SYSTEM INCLUDING SEMICONDUCTOR DEVICE

TECHNICAL FIELD

Reference to Related Application

This application is based upon and claims the benefit of the priority of Japanese patent application No. 2009-260456, filed on Nov. 13, 2010, the disclosure of which is incorporated herein in its entirety by reference thereto.
The present invention relates to a semiconductor device, a method for controlling the same, and a data processing system including the semiconductor device. In particular, the present invention relates to a semiconductor device including a multiplexer converting a plurality of data inputted in parallel into serial data, a method for controlling the semiconductor device, and a data processing system including the semiconductor device.

BACKGROUND

When data is transferred among a plurality of semiconductor devices or when data is transferred from a semiconductor device in response to a request from a data processor, parallel data in a semiconductor device is converted into serial data and the data is transferred in synchronization with a clock at high speed. For example, Joint Electron Device Engineering Council (JEDEC) Solid State Technology Association defines standards for various types of double data rate synchronous dynamic random access memory (DDR SDRAM). Based on such standards, a plurality of address data transferred in series from a memory controller is converted into parallel data in a memory device, and the parallel data is written in a memory. Also, a plurality of address data read in parallel from a memory is converted into serial data, and the data is transferred to a memory controller. Particularly, when parallel data is converted to serial data, a multiplexer is used.

Patent Document 1 discloses a memory device that converts data read from a memory in parallel into serial data at high speed. FIG. 3 of Patent Document 1 discloses a circuit including multiplexers each converting two data that is read from a memory and that is inputted in parallel into serial data. The multiplexers are connected in series in three stages to convert 8-bit parallel data into 8-bit serial data. Patent Document 1 does not disclose the configuration of these multiplexers. However, as disclosed in FIG. 14 of Patent Document 2, a 2-to-1 multiplexer using two transmission gates is generally used. Each of the transmission gates has an input node connected to data inputted in parallel and an output node connected in wired-OR. According to Patent Document 2, the two transmission gates are switched by an edge of an identical clock.
Patent Document 1:
Japanese Patent Kokai Publication No. JP-P2009-211800A, which corresponds to US Patent Application Publication No. US2009/0219764A1.
Patent Document 2:
Japanese Patent Kokai Publication No. JP-P2001-118382A, which corresponds to U.S. Pat. No. 6,335,889B1.

SUMMARY

The entire disclosures of Patent Documents 1 and 2 are incorporated herein by reference thereto.

The following analyses are given by the present invention. When parallel data is converted into serial data and the serial data is transferred, if multiplexers are connected in a plurality of stages in series as disclosed in Patent Document 1, a large delay is caused. Further, if turning on/off of a transmission gate switch is changed by an identical signal as disclosed in Patent Document 2, particularly when the switch is changed at high speed, interference between data is caused. Thus, such configuration is not desirable. However, there are some methods to prevent interference between data. For example, as a first method, a high frequency clock can be used to increase an interval between a timing at which the switch turns off and a timing at which the switch turns on. As a second method, a delay circuit can be used so that a timing at which the switch turns on lags a timing at which the switch turns off. As a third method, a DLL or a PLL can be used to generate a clock having a leading phase to turn off the switch by an edge of the clock having a leading phase. However, based on the first and the third methods, even when access is not necessary, power consumption is increased. Thus, the first and the third methods are not desirable. Further, based on the second method, a data output timing is delayed with respect to a reference clock, and variations of the delay time are caused. Thus, the second method is not desirable, either.

According to a first aspect of the present invention, there is provided a semiconductor device that includes a multiplexer including: a plurality of switches each having input and output nodes; and a plurality of switch control circuits each controlling electrical continuity and discontinuity of a corresponding one of the plurality of switches. Output nodes of the plurality of switches are commonly coupled to a first node, and each of the plurality of switch control circuits includes a detection circuit. Each of the plurality of switch control circuits controls an electrical continuity of the corresponding one of the plurality of switches to conducting in a first cycle in time series. Each of the plurality of switch control circuits controls the electrical continuity of the corresponding one of the plurality of switches to non-conducting, when a corresponding one of the plurality of detection circuits detects that a data signal at a corresponding one of the input nodes appears at a corresponding one of the output nodes.

According to a second aspect of the present invention, there is provided a semiconductor device including a multiplexer and an output buffer. The multiplexer includes: n switches (n is an integer of 2 or greater) each including an input node receiving a different data signal and each including an output node coupled to an input node of the output buffer; and a plurality of switch control circuits each corresponding to a respective one of the n switches. Each of the plurality of switch control circuits controls electrical continuity of a corresponding one of the n switches to conducting and the n switches synchronized with a first cycle and each phase of establishing the electrical continuities of the n switches is different by 1/n of the cycle from adjacent phases. Each of the plurality of switch control circuits controls electrical continuity of the corresponding one of the plurality of switches to non-conducting when each of the plurality of switch control circuits detects that an output-side data signal of the corresponding an output-side of one of the n switches matches an input-side data signal of the corresponding an input-side of one of the n switches. The multiplexer converts n data that is inputted in parallel to the n switches and that changes in the first cycle into serial data that changes in 1/n of the first cycle. The output buffer outputs the serial data from an output node of the output buffer.

According to a third aspect of the present invention, there is provided a method for controlling a semiconductor device.

The method controls the semiconductor device including a multiplexer converting a plurality of data, each of which is inputted in parallel to a respective one of a plurality of switches including a plurality of output nodes connected in wired-OR, into serial data by establishing electrical continuity of the plurality of switches in a time-division manner. The method includes: establishing electrical continuity of a first switch of the plurality of switches in synchronization with a time-division signal; detecting that an output-side data signal of an output-side of the first switch matches an input-side data signal of an input-side of the first switch after electrical continuity of the first switch is established; and breaking electrical continuity of the first switch before electrical continuity of a second switch of the plurality of switches is established by the detection in synchronization with the time-division signal.

According to a fourth aspect of the present invention, there is provided a data processing system including: a first semiconductor device; a second semiconductor device; and a system bus connecting the first and second semiconductor devices. The second semiconductor device includes: an output buffer; and a multiplexer including: a plurality of switches each including input and output nodes; a plurality of switch control circuits each controlling electrical continuity and electrical discontinuity of a corresponding one of the plurality of switches. Output nodes of the plurality of switches are commonly connected to an input node of the output buffer, and each of the plurality of switch control circuits includes a detection circuit. Each of the plurality of switch control circuits controls electrical continuity of the corresponding one of the plurality of switches to conducting in a first cycle in time series. Each of the plurality of switch control circuits controls electrical continuity of the corresponding one of the plurality of switches to non-conducting, when each of the plurality of detection circuits detects that a data signal at a corresponding one of the input nodes of the plurality of switches appears at a corresponding one of the output nodes. Converted serial data is outputted from the output buffer to the system bus in response to a request from the first semiconductor device.

The meritorious effects of the present invention are summarized as follows.

According to the present invention, interference caused when switches are changed can be prevented, and without using a clock having a cycle shorter than a first cycle (a cycle of parallel data), data can be converted into serial data having a cycle 1/n of the first cycle without a delay.

PREFERRED MODES

Figure 1:
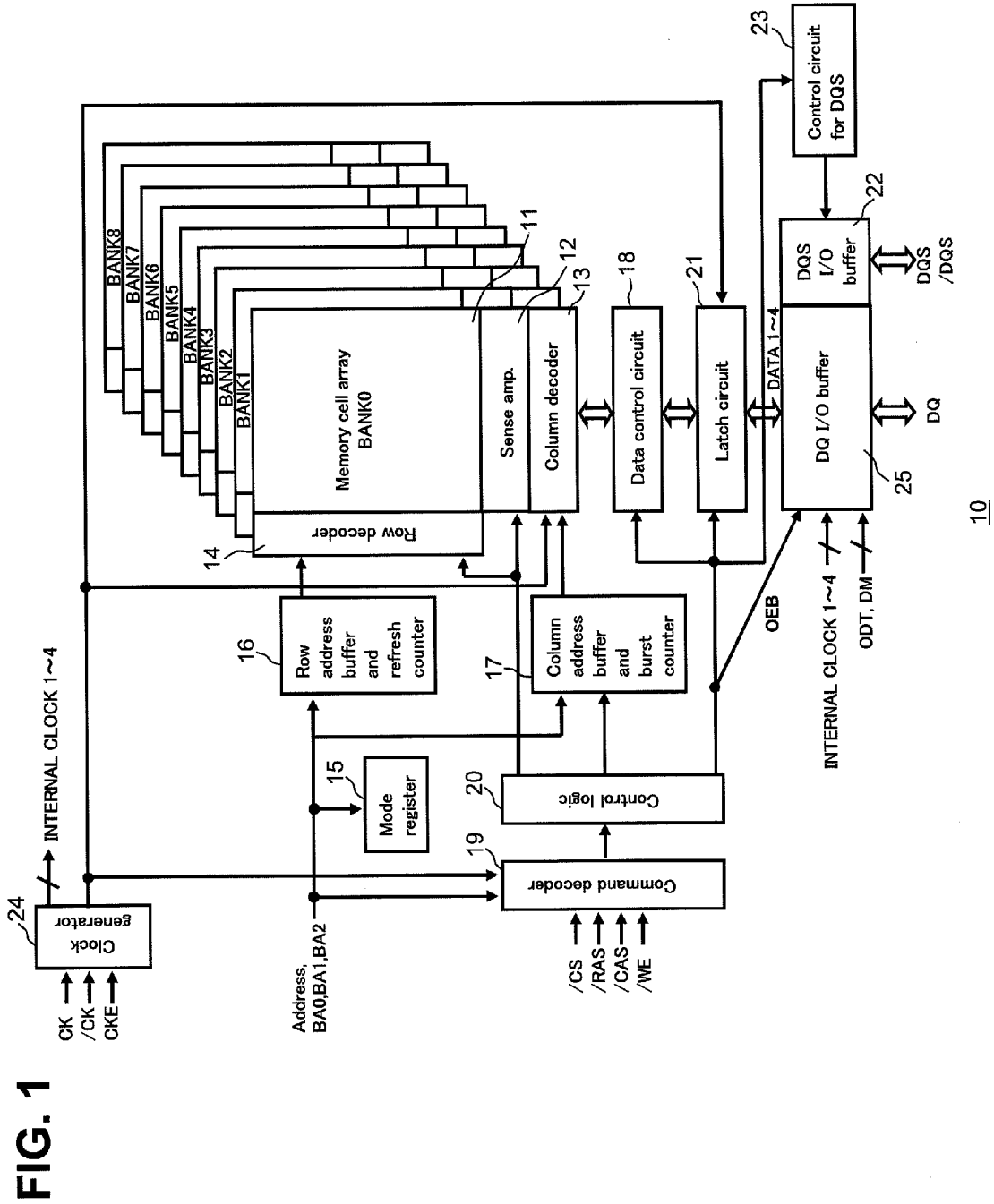
FIG. 1 is a block diagram of an overall configuration of a semiconductor device according to an example of the present invention.

Prior to detailed description of examples of the present invention, outlines of exemplary embodiments of the present invention will be described. The drawings and reference characters referred to in the description of the following outlines are used to illustrate examples of the exemplary embodiments. Therefore, variations of the exemplary embodiments according to the present invention are not limited by the drawings and reference characters.

Figure 2:
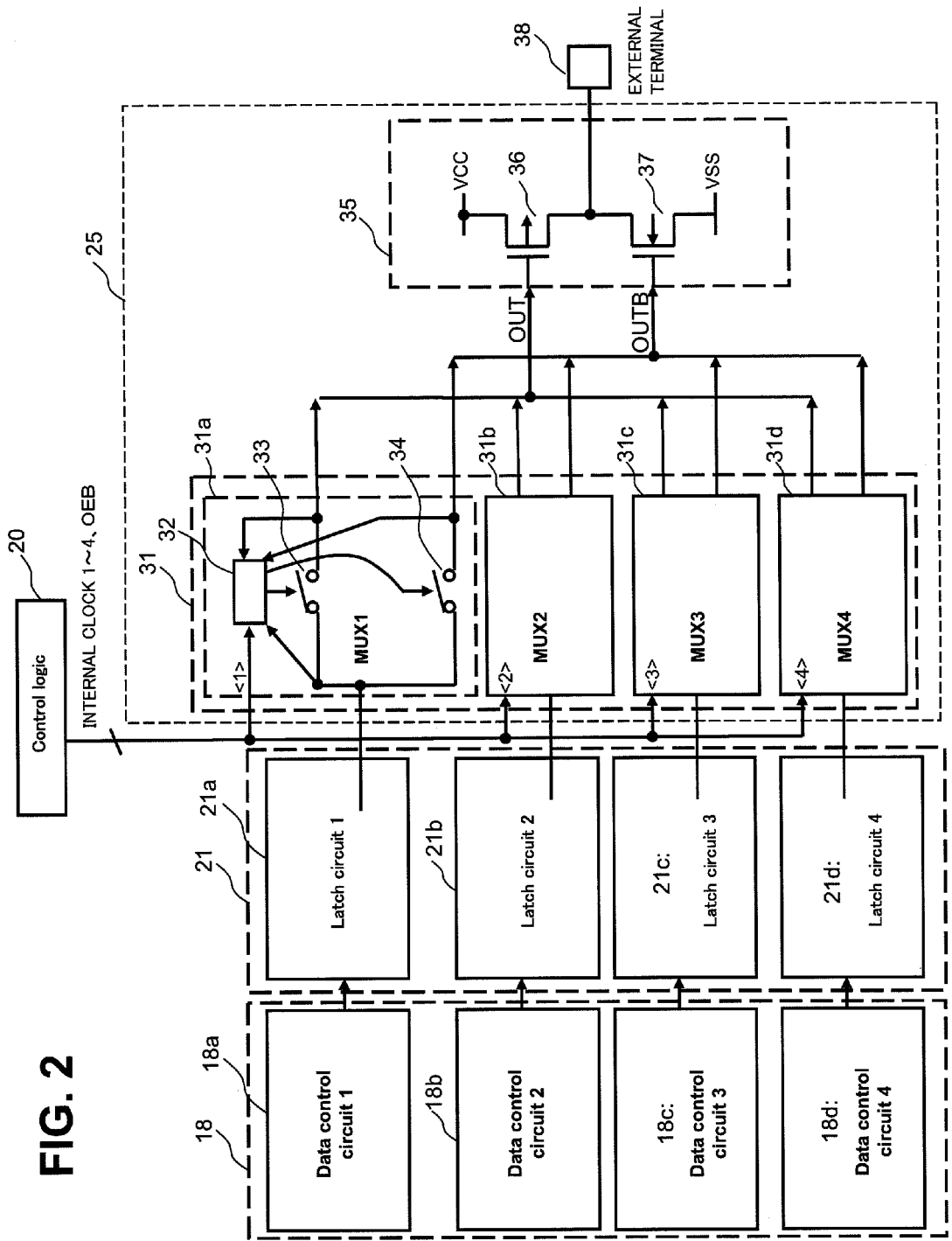
FIG. 2 is a block diagram of a configuration around a multiplexer according to example 1.
Figure 4:
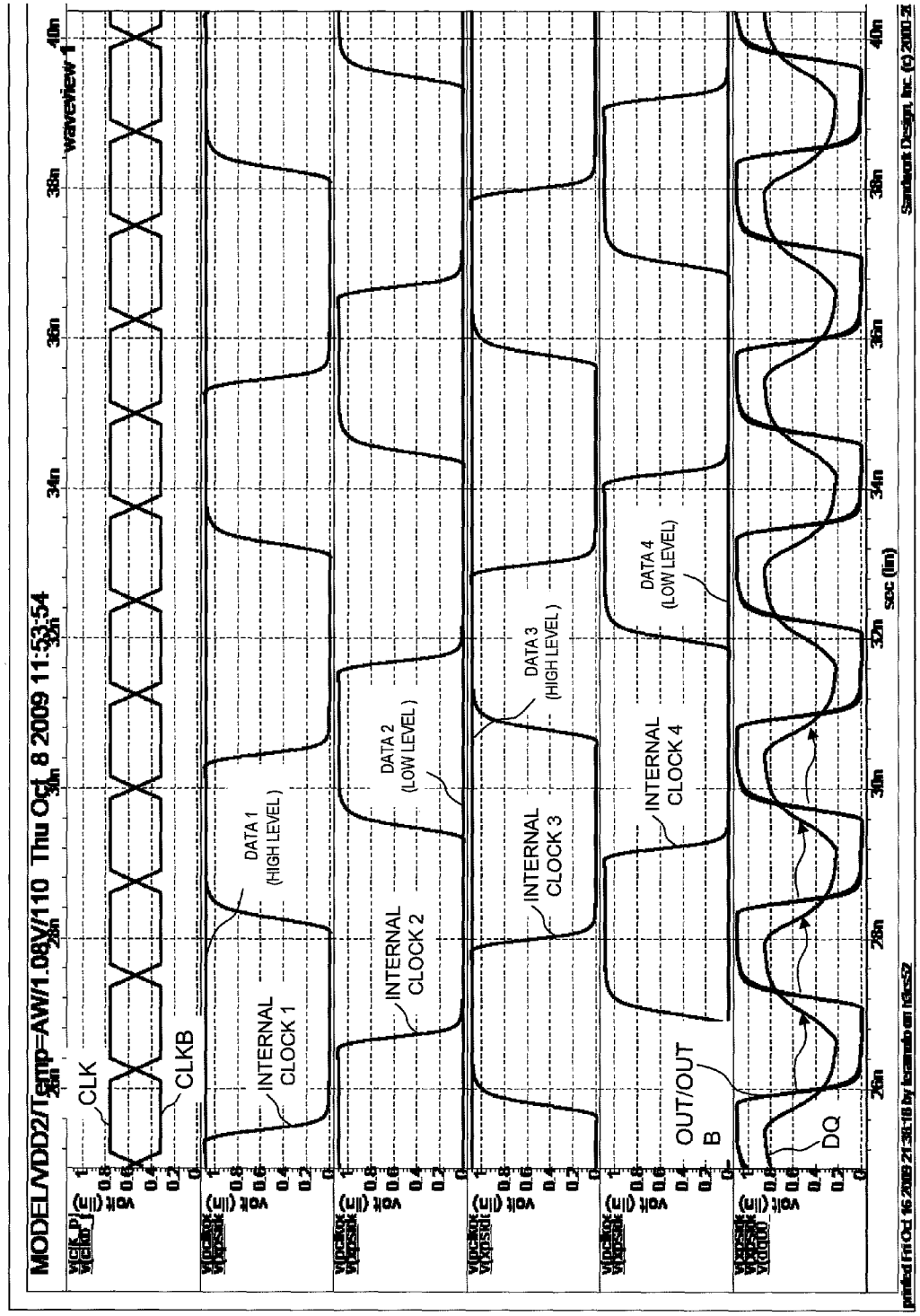
FIG. 4 is a waveform diagram illustrating an overall operation of the multiplexer according to example 1.

For example, as illustrated in FIG. 2, a semiconductor device according to an exemplary embodiment of the present invention includes a multiplexer 31. The multiplexer 31 includes n switches each having an input node supplied with a different data signal and an output node connected to an input node of an output buffer 35 (n is an integer of 2 or greater and n=4 in FIG. 2). In FIG. 2, switches 33 and 34 are defined as a single switch. Namely, together with the switches of switch units 31b to 31d (not illustrated), the multiplexer 31 includes a total of four switches connected to input nodes of the single output buffer 35. The multiplexer 31 also includes a plurality of switch control circuits 32 (while an internal configuration of each of the switch units 31b to 31d is not illustrated, each of the switch units 31b to 31d includes a respective one of the switch control circuits 32). Each of the switch control circuits 32 is arranged for a switch, and the switches are turned on synchronized with a first cycle. The turn-on phases of the switches are different from each other. Each phase is shifted by 1/n cycle from adjacent phases. For example, a control logic 20 provides internal clocks for generating the turn-on timings. One example of internal clocks is shown in FIG. 4. Each of the switch control circuits 32 turns off a respective switch when detecting that an output-side logic level of the switch matches an input-side logic level of the switch. In other words, each of the switches is changed from an electrically discontinuous state to an electrically continuous state in the first cycle, and if an input-side data signal of the switch appears at an output-side node thereof, the switch control circuit 32 changes the switch from an electrically continuous state to an electrically discontinuous state. The multiplexer 31 converts data that is inputted in parallel to the n switches and that changes in the first cycle (data from latch circuits 21a to 21d) into serial data that changes in a cycle 1/n of the first cycle. Based on the above configuration, when each of the switch control circuits detects that an output-side logic level (data signal) of a respective one of the switches matches an input-side logic level (data signal) of the switch, the switch is turned off. In other words, to turn off a turned-on switch, a clock (a respective one of the control signals having the first cycle) that turns on the switch is not used. The switch turns off at a timing (self-timing) when the switch establishes electrical continuity and a respective switch control circuit detects that output-side data of the switch corresponds to input-side data of the switch. Thus, each of the plurality of control signals that turns on a respective one of the plurality of switches is a signal having the first cycle, and the number of phases of the plurality of control signals corresponds to the number of the plurality of switches. Each of the signals that turns off a respective one of the plurality of switches is a signal generated by the self-timing. By using the self-timing, while each of the control signals has the first cycle, it is possible to prevent interference caused when a plurality of switches are changed (a switch that is turned on and a switch that is turned off), that is, it is possible to prevent bus fight at an output node to which output nodes of the individual switches are commonly connected. Based on this technical concept, even if the number of the switches connected in parallel is increased from n to m, since each of a plurality of the switches (m switches) is turned off at the self-timing, the clock of each of a plurality of control signals (m control signals) does not need to have a frequency faster than the first cycle (frequency that is m times faster). Namely, the clock of each of the m control signals may have the first cycle. Further, based on this technical concept, even if a data change cycle (data rate) is 1/n of the first cycle, conversion into serial data is possible, without a timing skew attributable to 1/n. In the present description, "turning on" signifies establishment of electrical continuity and "turning off" signifies electrical discontinuity.

In addition, the switch control uses a set/reset circuit that limits the number of the operations of changing a respective switch from an electrical continuous state to an electrical discontinuous state to one. Thus, oscillation of the switch circuit can be prevented.

Next, examples will be described in detail with reference to the drawings.

Example 1

FIG. 1 is a block diagram of an overall configuration of a semiconductor device 10 according to example 1. The semiconductor device 10 illustrated as an example in FIG. 1 is a DDR (double data rate: transferring data in synchronization with both the rising and falling edges of a clock signal) SDRAM (synchronous dynamic random access memory) including eight banks. In FIG. 1, a row decoder 14 decodes a row address and drives a selected word line (not illustrated). A sense amplifier 12 amplifies data read through a bit line (not illustrated) of a memory cell array 11. When a refresh operation is carried out, the sense amplifier 12 amplifies cell data read through a bit line connected to a cell of a word line selected by a refresh address and writes back the data into the cell. A column decoder 13 decodes a column address, turns on a selected Y switch (not illustrated), selects a bit line, and connects the bit line to an IO line (not illustrated). A command decoder 19 receives a predetermined address signal and control signals such as a chip select signal/CS, a row address strobe signal/RAS, a column address strobe signal/CAS, and a write enable signal/WE and decodes commands (/ in the names of the signals represents signals that are brought to be active at a low level). Controlled by a control logic 20 (clock generation circuit) receiving a control signal from the command decoder 19, the column address buffer and burst counter 17 receives a column address, generates an address of a burst length, and supplies the address to the column decoder 13. A mode resistor 15 receives an address signal and signals BA0, BA1, and BA2 for selecting a bank (selecting one of the eight banks) and outputs a control signal to the control logic 20.

A row address buffer of a row address buffer and refresh counter 16 receives an inputted row address and outputs the row address to the row decoder 14. A refresh counter of a row address buffer and refresh counter 16 receives a refresh command, executes a count-up operation, and outputs the count output as a refresh address. The row address from the row address buffer and the refresh address from the refresh counter are inputted to a multiplexer (not illustrated). When a refresh operation is carried out, the refresh address is selected. Otherwise, the row address from the row address buffer is selected and supplied to the row decoder 14.

A clock generator 24 receives complementary external clocks CK and /CK that are supplied to the DRAM device. When a clock enable signal CKE is at a high level, the clock generator 24 outputs internal clocks, and when the clock enable signal CKE is at a low level, the clock generator 24 stops supplying the clocks. In example 1, based on the external clocks CK and /CK, which are used as system clocks, the clock generator 24 generates four-phase internal clocks 1 to 4 each having a cycle twice that of the external clocks CK and /CK and a phase shifted by ¼ cycle from adjacent clocks. The four-phase internal clocks 1 to 4 may be generated by the individual intersection points of the external clocks CK and /CK or serially generated by a single intersection point.

A data control circuit 18 executes input/output processing on write data and read data, and a latch circuit 21 latches the write data and read data.

A reference character DM represents a data mask signal of write data. If the DM signal is at a low level during a write operation, data is written. Reference characters DQS and /DQS represent differential data strobe signals defining timings at which data is written and read. These differential data strobe signals DQS and /DQS are IO signals used as input signals during a write operation and output signals during a read operation.

A DQS control circuit 23 controls a DQS I/O buffer 22 based on a read/write operation of the semiconductor device 10. To reduce power consumption, a DLL is not included in the semiconductor device 10 of FIG. 1.

A DQ I/O buffer 25 is a circuit that executes input/output processing on data inputted to and outputted from a data terminal DQ. The DQ I/O buffer 25 is supplied with an output enable signal OEB and the internal clocks 1 to 4 as signals for controlling the output of read data. When read data is outputted, the output enable signal OEB is brought to a low level (enabled), data 1 to 4 sent in parallel from the latch circuit 21 is converted to serial data in synchronization with the four-phase internal clocks 1 to 4, and the serial data is outputted from the DQ output buffer. Further, in synchronization with the data outputted from the DQ output buffer, the DQS and /DQS signals are outputted from the DQS I/O buffer 22 as data strobe signals.

FIG. 2 is a partially enlarged block diagram of FIG. 1, illustrating the data control circuit 18, the latch circuit 21, and the DQ I/O buffer 25. While FIG. 2 illustrates a circuit outputting read data via the DQ terminal, FIG. 2 does not illustrate a circuit inputting write data. In FIG. 2, both of the data control circuit 18 and the latch circuit 21 have four systems, namely, four channels. The DQ I/O buffer 25 of FIG. 1 includes a multiplexer 31 and an output buffer 35. Depending on the layout, the data control circuit 18 and the latch circuit 21 may be arranged near the memory cell array 11 and the multiplexer 31 may be arranged near the external terminal (DQ terminal). However, since data is separately sent from the latch circuit 21 to the multiplexer 31 through four systems (four channels) in parallel, the semiconductor device 10 can have a reduced internal data transfer rate. The multiplexer 31 is controlled by the four-phase internal clocks 1 to 4 and the output enable signal OEB outputted from the control logic 20. When the output enable signal OEB is at a low level, the multiplexer 31 converts data separately sent in parallel through 4 systems from latch circuits 21a to 21d into serial data in synchronization with the internal clocks 1 to 4. Since four data control circuits 18a to 18d and four latch circuits 21a to 21d are arranged to form 4 systems, the data control circuit 18a to 18d can read data in parallel from the memory cell array 11 and the latch circuits 21a to 21d can hold the data read in parallel.

The multiplexer 31 includes four switch units 31a to 31d each arranged per system (channel). Among these four switch units 31a to 31d, FIG. 2 illustrates an internal configuration of the switch unit 31a corresponding to a single channel. As illustrated by the switch unit 31a, each of the switch units 31a to 31d includes: switches 33 and 34 sending data supplied to an input node through a channel (signal outputted from the latch circuit 21a) to output nodes (input nodes OUT and OUTB of the output buffer 35); and a switch control circuit 32 controlling the switches 33 and 34. The switch control circuit 32 receives one of the internal clocks 1 to 4, the signals supplied to the nodes OUT and OUTB, and the output signal from the latch circuit 21a. Based on one of the internal clocks 1 and 4, the switch control circuit 32 establishes electrical continuity of the switch 33. Further, the switch control circuit 32 compares the output signal from the latch circuit 21a with the signal supplied to the node OUT, and based on results of the comparison, the switch control circuit 32 breaks the electrical continuity of the switch 33. On the other hand, based on one of the internal clocks 1 and 4, the switch control circuit 32 establishes electrical continuity of the switch 34. Further, the switch control circuit 32 compares the output signal from the latch circuit 21a with the signal supplied to the node OUTB, and based on results of the comparison, the switch control circuit 32 breaks the electrical continuity of the switch 34. These operations will be described in detail later. The input nodes OUT and OUTB of the output buffer 35 are a plurality of first nodes to which output signals from the switch units 31a to 31d are commonly supplied. Each of the switch units 31a to 31d is supplied with the output enable signal OEB and one of the four-phase internal clocks 1 to 4 each having a different phase. The switch control circuit 32 performs different switching control, depending on whether the output enable signal OEB is enabled or disabled. When the output enable signal OEB is at a low level and is enabled, the switch control circuit 32 uses an edge of a respective one of the internal clocks 1 to 4 to turn on (establishes electrical continuity of) the switches 33 and 34. The switches 33 and 34 are turned off when the switch control circuit 32 detects that a switch output-side logic level matches the input-side logic level. Namely, if the switches 33 and 34 are switches that output data having the same phase as that of data inputted thereto, when an output-side logic level (high level or low level) is the same as an input-side logic level, the switch control circuit 32 turns off the switches 33 and 34. If the switches 33 and 34 are switches that output data inverted with respected to the input thereof, when the switch control circuit 32 detects that an output-side logic level is the same as the inversion level of an input-side logic level, the switch control circuit 32 turns off the switches 33 and 34. Thus, "match" means, for example, when the detection circuit (32) detects that a data signal (output signal from the latch circuit 21a) inputted to the input node of the switch (33) appears at the output node (OUT).

Each switch is turned on in synchronization with its respective internal clock. After the switch is turned on, when the switch control circuit 32 detects that an output-side logic level of the switch matches an input-side logic level of the switch, the switch is turned off. Thus, since on-state of one switch does not overlap that of another switch when switches are changed, no interference is caused. As described above, each switch is turned on in synchronization with its respective internal clock. Thus, even when a DLL is not used, it is possible to minimize a delay of a timing at which the switch is turned on, namely, a timing at which converted series data is outputted from the external terminal 38, from the internal clock and variations of the timing.

When the output enable signal OEB is enabled, turning on/off of the switches 33 and 34 is controlled in the same way. Thus, potentials at the nodes OUT and OUTB are substantially equal to each other.

When the output enable signal OEB is at a high level (disabled), the switch control circuit 32 separately controls the switches 33 and 34 so that the potentials at the nodes OUT and OUTB are fixed at high and low levels, respectively.

The output buffer 35 includes: a P-type MOS transistor 36, which is a first conductivity type output transistor connected to a first power supply VCC and turned on/off (continuity/discontinuity) based on the potential at the first node OUT; and an N-type MOS transistor 37, which is a second conductivity type output transistor connected to a second power supply VSS and turned on/off (continuity/discontinuity) based on the potential at the second node OUTB. Since the potentials at the input nodes OUT and OUTB are separately controlled, the output buffer 35 functions as a tri-state output buffer that outputs a high level, a low level, and a high-impedance level. Namely, such tri-state output buffer has binary logic output states and a high-impedance state. The output buffer 35 has a drain connected to an external terminal (DQ terminal) 38 and can output serial data converted by the multiplexer 31 to the outside of the semiconductor device 10 via the external terminal 38.

While the number of channels is four in FIG. 2, generally, the number of channels may be n (n is an integer of 2 or greater). When n channels are used, the clock generator 24 of FIG. 1 needs to generate n-phase internal clocks. Further, the number of the data control circuits (18a to 18d in FIG. 2), the number of the latch circuits (21a to 21d in FIG. 2), and the number of the switch units (31a to 31d in FIG. 2) need to be changed depending on the channel number n. A necessary number of the channels can be used depending on the system.

Figure 3:
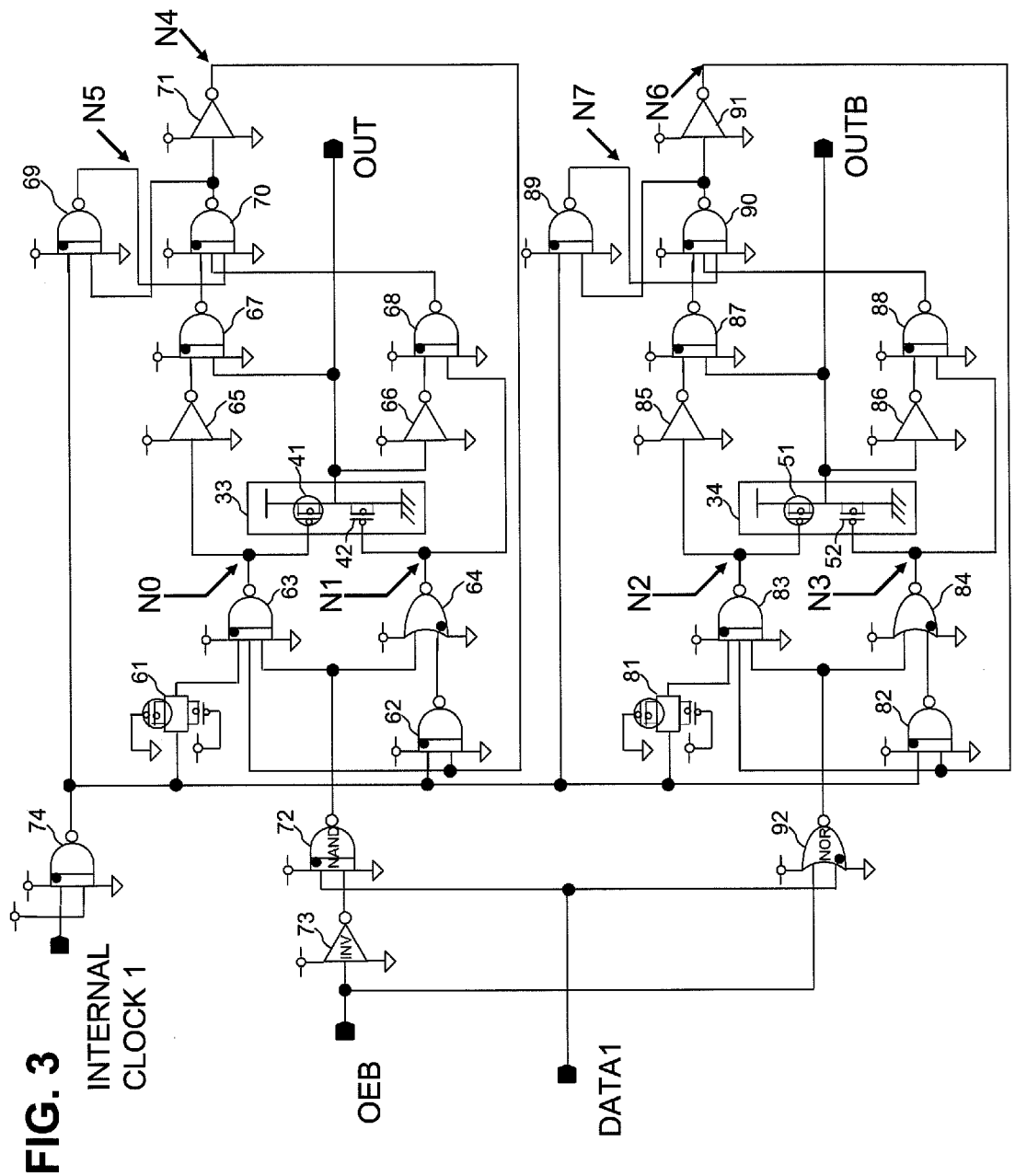
FIG. 3 is a block diagram of switches and a switch control circuit in the multiplexer according to example 1.

FIG. 3 is a block diagram illustrating internal configurations of the switches 33 and 34 and the switch control circuit 32. Among the internal configurations of FIG. 3, all the circuits, other than those forming the switches 33 and 34, form the switch control circuit 32. Data 1 is data outputted from the latch circuit 21a.

The switch 33 includes a P-type MOS transistor 41 and an N-type MOS transistor 42. The switch 33 is a tri-state inversion switch that outputs inverted data of data 1 based on the switch control circuit 32. Namely, when the switch 33 is turned on, the switch 33 outputs an inverted signal of data 1. Namely, each of the switches 33 and 34 is a tri-state buffer having binary logic output states and a high-impedance state. Since the switch 34 has the same configuration as that of the switch 33, repetitive description thereof will be omitted.

Further, the switch control circuit 32 includes a circuit controlling the switch 33 and a circuit controlling the switch 34. The circuits controlling the switches 33 and 34 are illustrated in the upper half and lower half of FIG. 3, respectively. The circuit controlling the switch 33 and the circuit controlling the switch 34 are identical, except that the circuit controlling the switch 33 includes a NAND gate 72 that receives an inverted signal of the output enable signal OEB and the circuit controlling the switch 34 includes a NOR gate 92 that receives the output enable signal OEB instead of the NAND gate 72. When the output enable signal OEB is at a low level (enabled), both the NAND gate 72 and the NOR gate 92 output an inverted signal of data 1. Namely, in this case, the circuit controlling the switch 33 and the circuit controlling the switch 34 have the same circuit configuration and operation. Thus, only the circuit controlling the switch 33 will be described.

In the circuit controlling the switch 33, an inverter 65, a NAND gate 67, an inverter 66, and a NAND gate 68 function as a circuit (detection circuit) that detect whether an input-side logic level of the switch 33 matches an output-side logic level of the switch 33. Since the switch 33 is a switch that inverts and outputs the data inputted thereto, when a logic level at the node OUT, which is an output-side node of the switch 33, is inversion of an input-side logic level at nodes N0 and N1, either the NAND gate 67 or the NAND gate 68 is brought to a low level. More specifically, when the P-type MOS transistor 41 is turned on to increase a potential at the node OUT to a high level, once the node OUT is increased to a high level, the NAND gate 67 outputs a low level. When the N-type MOS transistor 42 is turned on to decrease a potential at the node OUT to a low level, once the node OUT is decreased to a low level, the NAND gate 68 outputs a low level.

NAND gates 69 and 70 are used to form a set/reset circuit. Nodes N5 and N4 of the set/reset circuit are reset when either of the NAND gate 67 or 68 is decreased to a low level and an output-side logic of the switch matches an input-side logic of the switch. Further, when the internal clock 1 is increased to a high level, the nodes N5 and N4 are set. A CMOS transfer gate 61 is used to adjust delay time and is always on logically. Regarding the above configuration, the circuit controlling the switch 34 is identical to the circuit controlling the switch 33. Thus, repetitive description will be omitted.

Next, a data output operation of the semiconductor device 10 will be described with reference to an operation waveform diagram of FIG. 4. Reference characters CLK and CLKB denote system clock waveforms supplied to the semiconductor device 10 from the outside. While the clocks CLK and CLKB have an identical frequency, the phases thereof are inverted with respect to each other. The clock generator 24 of FIG. 1 generates the internal clocks 1 to 4 from the clocks CLK and CLKB. The internal clocks 1 to 4 generated by the clock generator 24 have a cycle twice that of the system clocks CLK and CLKB, and each of the internal clocks 1 to 4 has a phase that lags that of an adjacent clock by ¼ cycle. Since the phase delay of each of the internal clocks is half a cycle of the system clocks CLK and CLKB, the internal clocks 1 to 4 can be synthesized easily from the system clocks CLK and CLKB.

In FIG. 4, data 1, which is obtained through channel 1, and data 3, which is obtained through channel 3, is fixed at a high level. Data 2, which is obtained through channel 2, and data 4, which is obtained through channel 4, is fixed at a low level. Thus, the nodes OUT and OUTB of FIG. 2 are decreased to a low level in synchronization with a falling edge of the internal clock 1 and increased to a high level in synchronization with a falling edge of the internal clock 2. Subsequently, the nodes OUT and OUTB are increased to a high level and decreased to a low level repeatedly in synchronization with falling edges of the internal clocks.

A phase of a waveform outputted from the DQ terminal lags the phase of a waveform at the nodes OUT and OUTB. When the waveform at the nodes OUT and OUTB falls, the waveform at the DQ terminal rises with a delay, and when the waveform at the nodes OUT and OUTB rises, the waveform at the DQ terminal falls with a delay. Namely, within one cycle of an internal clock, four data that corresponds to the phase number of the internal clocks are converted to serial data, and the serial data is outputted from the DQ terminal.

Figure 5:
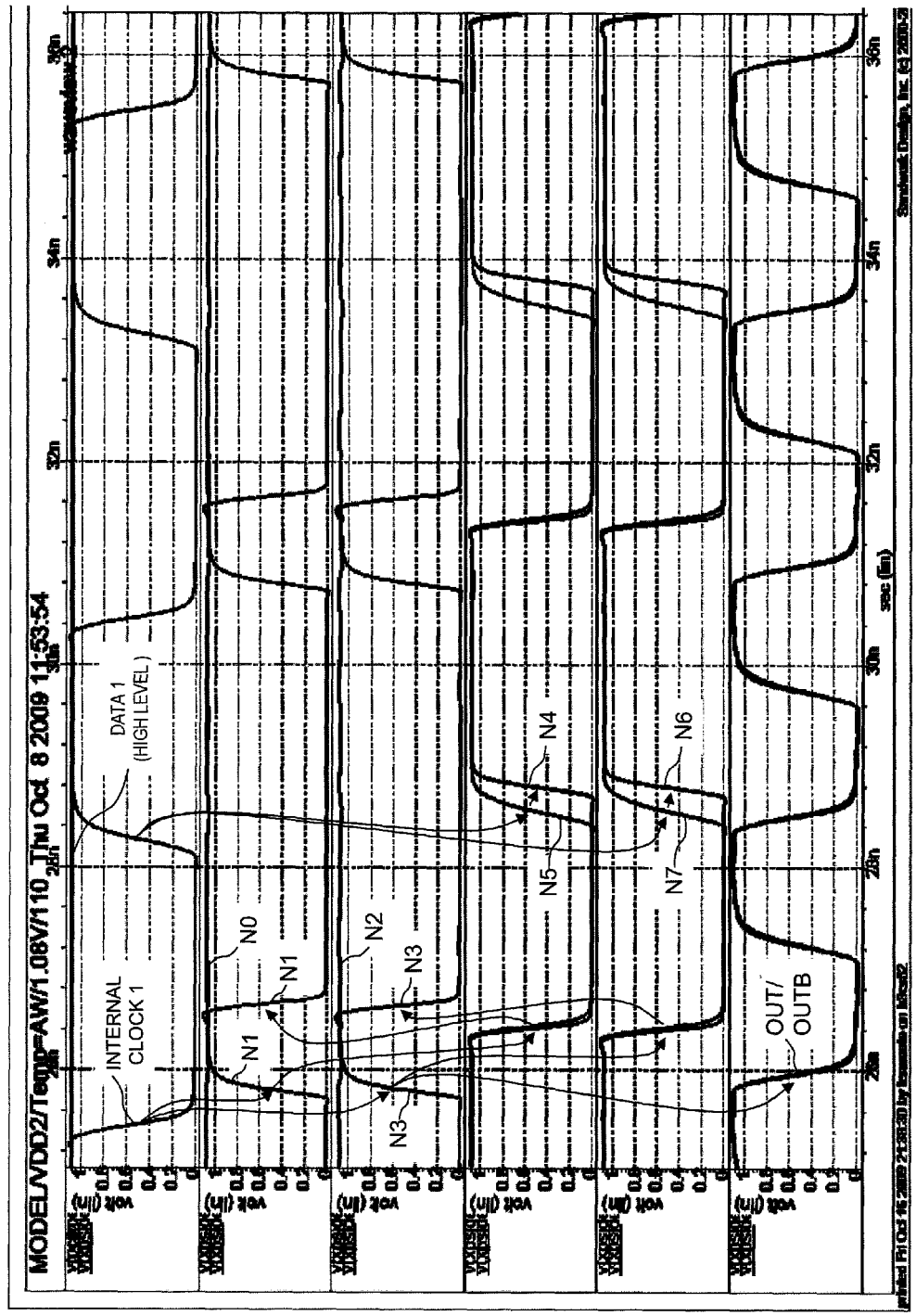
FIG. 5 is an operation waveform diagram of the switch control circuit according to example 1.

Next, FIG. 5 is an operation waveform diagram illustrating a waveform of the internal clock 1 and waveforms at the nodes N0 to N7 and the nodes OUT and OUTB in the switches 33 and 34 and the switch control circuit 32 of FIG. 3. An operation of the circuit of FIG. 3 will be described with reference to the operation waveform diagram of FIG. 5, assuming that the output enable signal OEB is at a low level. In FIG. 5, data 1 is fixed at a high level.

In FIG. 5, first, when the internal clock 1 is at a high level, the nodes N0 and N1 are at high and low levels, respectively. Thus, the switch 33 is turned off. Since the set/reset circuit formed by the NAND gates 69 and 70 are set, the nodes N4 and N5 are at a high level. When the internal clock 1 falls, since data 1 is at a high level, the node N1 rises. When the node N1 rises, the NMOS transistor 42 of the switch 33 is turned on, and the node OUT falls. Next, the NAND gate 68 outputs a low level, the set/reset circuit formed by the NAND gates 69 and 70 is reset, and the nodes N5 and N4 are decreased to a low level. Since the node N4 is decreased to a low level, the node N1 is decreased to a low level. Thus, the NMOS transistor 42 is turned off, and the switch 33 is brought in an off-state.

Next, when the internal clock 1 is increased to a high level, the set/reset circuit formed by the NAND gates 69 and 70 is set. Consequently, the nodes N5 and N4 are increased to a high level, and the initial state is reached again.

As illustrated in the operation waveform diagram of FIG. 5, data 1 is fixed at a high level. Therefore, since the node N0 is fixed at a high level, output from the NAND gate 67 is not decreased to a low level. However, if data 1 is at a low level, the node N0 is decreased to a low level in synchronization with a falling edge of the internal clock 1. Thus, when the node OUT is increased to a high level, the NAND gate 67 outputs a low level. Based on the circuit of FIG. 3, in synchronization with a falling edge of the internal clock 1, the switch control circuit 32 establishes electrical continuity of (turns on) the switch 33 to output inverted data of data 1 to the node OUT. If a logic at the node OUT becomes identical to the inverted data of data 1, that is, if an input-side logic of the switch matches an output-side logic of the switch, the switch control circuit 32 turns off the switch 33. Since the circuit of FIG. 3 includes the set/reset circuit formed by the NAND gates 69 and 70, even if the input-side logic of the switch 33 is caused to be different from the output-side logic by another switch when the internal clock 1 is at a low level, after the switch 33 is turned off, the switch 33 is not turned on again. Namely, irrespective of changes of a data signal at the first node caused when continuity of another one of the switches is established after discontinuity of one switch is established by a switch control circuit, the switch control circuit maintains discontinuity of the one switch until the next first cycle relating to the one switch of which discontinuity has been established.

Operations at the nodes N0, N1, N4, N5, and OUT relating to the switch 33 have thus been described. Operations at the nodes N2, N3, N7, N6, and OUTB relating to the switch 34 are the same as those at the above nodes relating to the switch 33, as long as the output enable signal OEB is at a low level. Thus, repetitive description will be omitted.

In FIG. 3, when the output enable signal OEB is at a high level, output from the NAND gate 72 is fixed at a high level. For the switch 33, this is the same as the logic where data 1 is fixed at a low level when the output enable signal OEB is at a low level. The node OUT is fixed at a high level.

In contrast, when the output enable signal OEB is at a high level, output from the NOR gate 92 is fixed at a low level. For the switch 34, this is the same as the logic where data 1 is fixed at a high level. The node OUTB is fixed at a low level. Thus, the output buffer 35 of FIG. 2 is brought to be in a high-impedance state.

Figure 6:
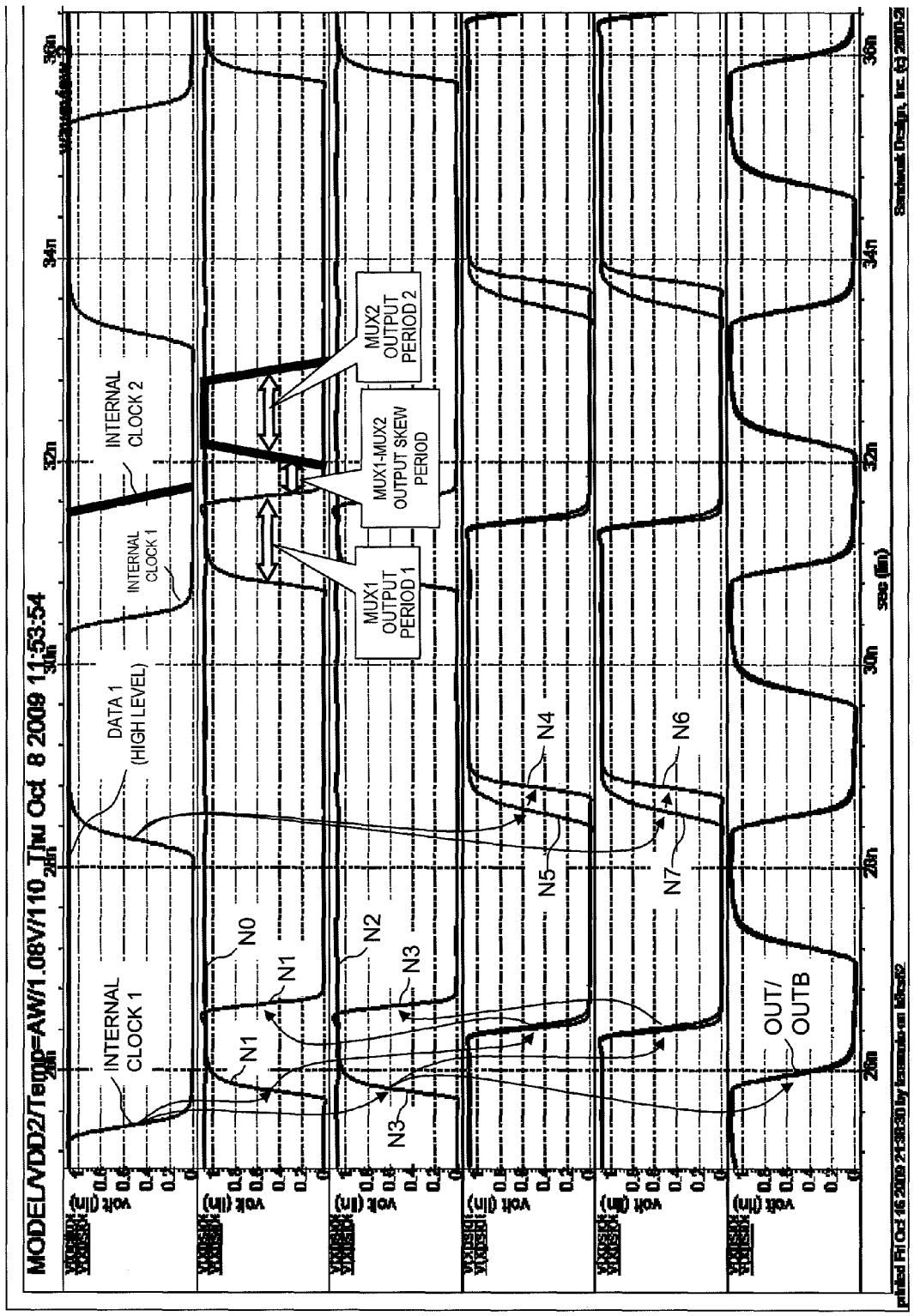
FIG. 6 illustrates a skew caused when switches are changed according to example 1.

FIG. 6 illustrates a skew caused when switches are changed according to example 1. In addition to the operation waveforms of FIG. 5, FIG. 6 schematically illustrates, at the top right thereof, operations based on the internal clock 2 that follows the internal clock 1. Since the node N1 is supplied with a signal applied to a gate voltage of the N-type MOS transistor of the switch 33, when the node N1 is at a high level, the N-type MOS transistor 42 of the switch 33 establishes continuity. Thus, in view of a skew between channels, the N-type MOS transistor 42 of the switch 33 needs to be turned off by the time when the switch P-type MOS transistor supplied with the next internal clock 2 is turned on. As illustrated in FIG. 6, the node N1 automatically falls when falling of a potential at the node OUT is detected. Thus, an output skew period can be ensured until the switch establishes continuity based on the next internal clock 2. This is the same as when data 1 is decreased to a low level and the P-type MOS transistor 41 of the switch 33 is turned on. The P-type MOS transistor can be turned off by the time when the switch N-type MOS transistor supplied with the next internal clock 2 is turned on. Namely, based on a feature of the present invention, the period during which the switch maintains electrical continuity (MUX output period 1, for example) is shorter than the period during which the respective clock signal is activated (low period of the internal clock 1, for example).

Figure 8:
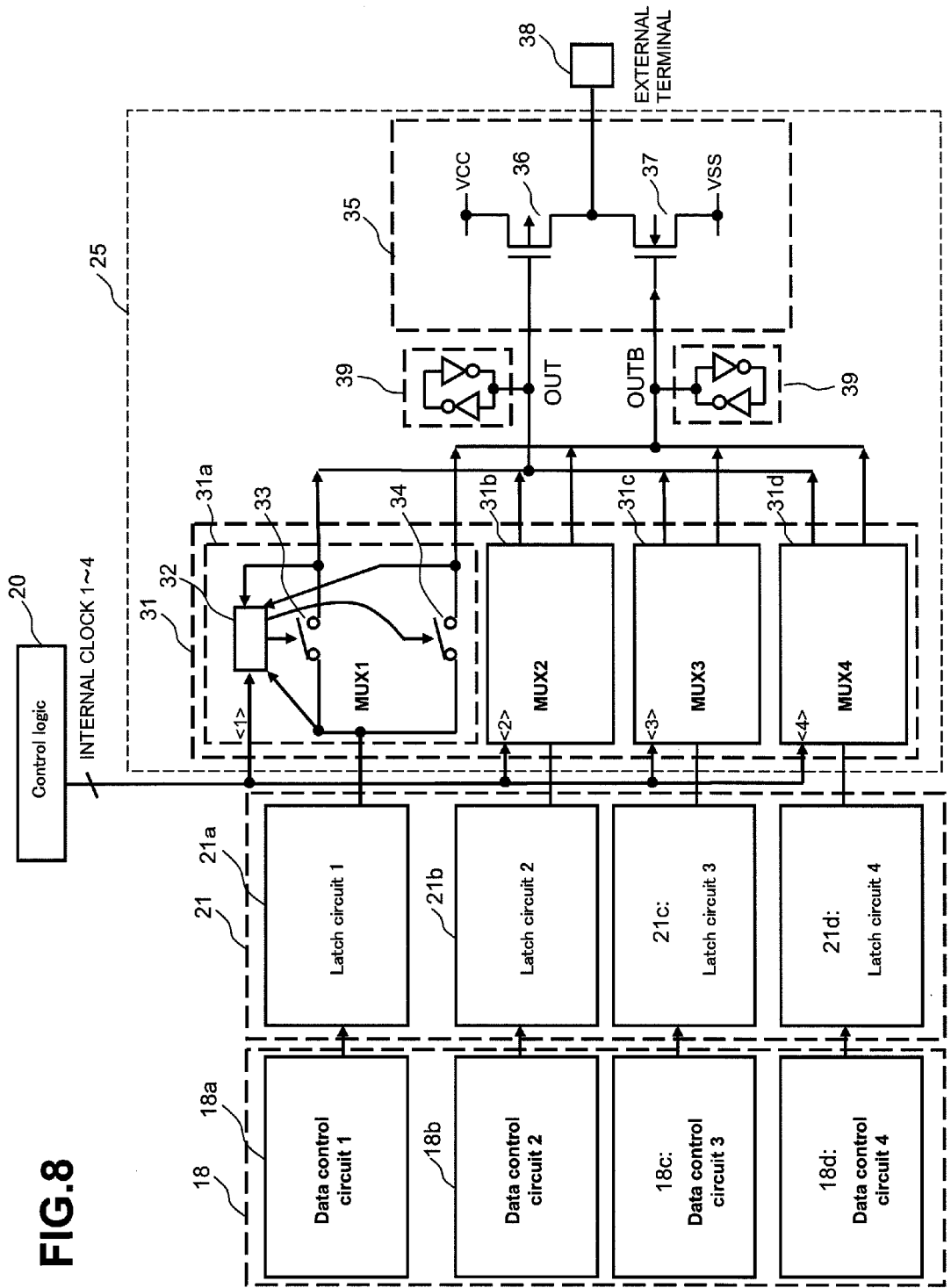
FIG. 8 is a block diagram of a configuration around the multiplexer according to a variation of example 1.

FIG. 8 is a block diagram of a configuration around the multiplexer according to a variation of example 1. As illustrated in FIG. 8, in addition to the configuration of FIG. 2 according to example 1, the DQ I/O buffer 25 according to this variation includes holding circuits 39 connected to the nodes OUT and OUTB. Other than the holding circuits 39, this variation is the same as example 1. Since these holding circuits 39 are arranged, potentials at the node OUT and OUTB can be held even after each switch is turned off. Output transistors of the holding circuits 39 have necessary and sufficiently small drive capabilities for holding potentials at the nodes OUT and OUTB when each of the switches of the multiplexer 31 is turned off. When a low frequency clock is used as the system clock or when output data needs to be held even after the internal clocks supplied to the multiplexer are stopped, by arranging these holding circuits, logic levels at the output terminals can be held stably.

Example 2

Figure 7:
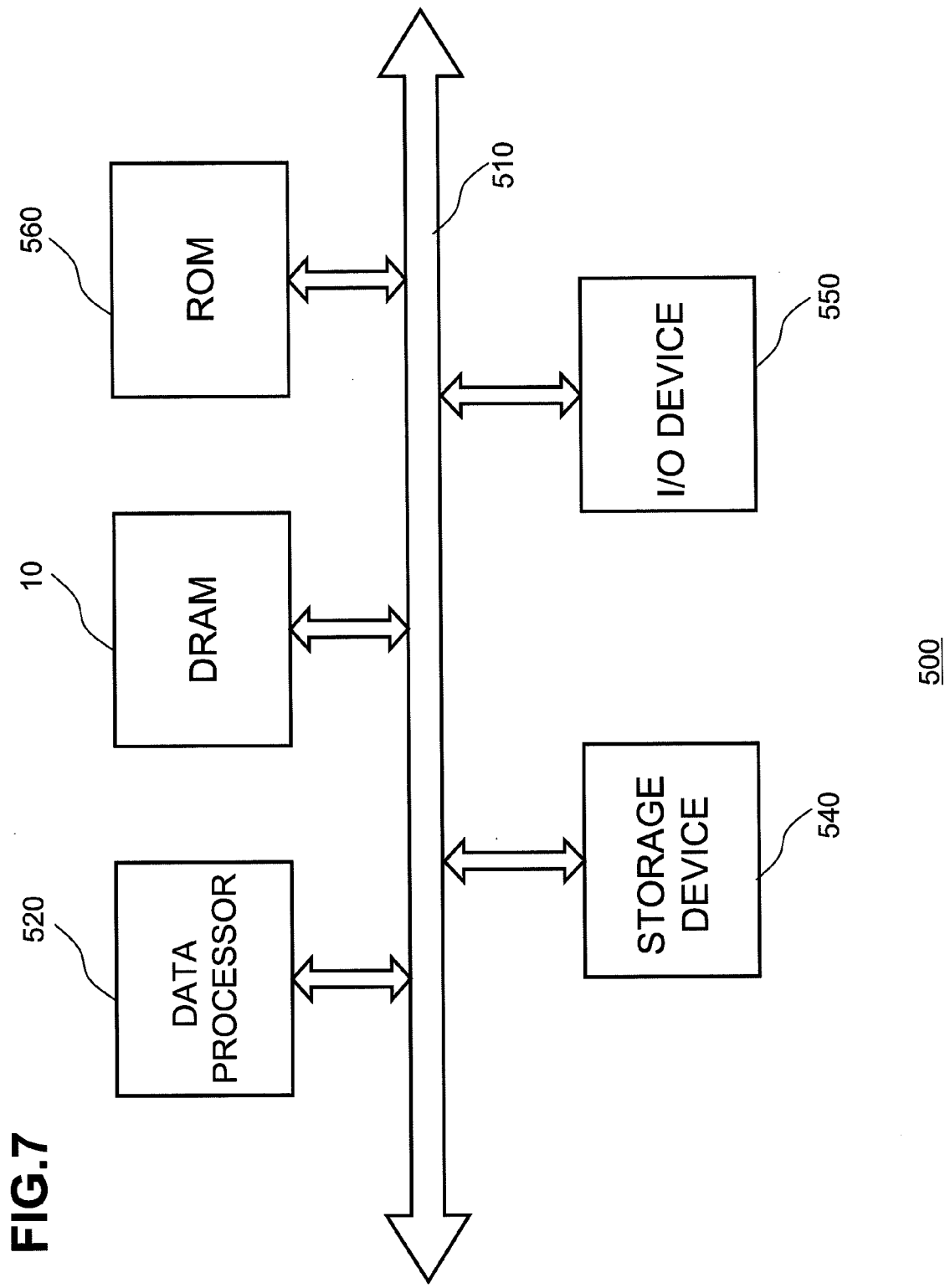
FIG. 7 is a block diagram of a data processing system according to example 2.

FIG. 7 is a block diagram of a data processing system using the semiconductor device 10. In a data processing system 500 of FIG. 7, a data processor 520 and the semiconductor device (DRAM) 10 are mutually connected via a system bus 510. For example, the data processor 520 may be a microprocessor (MPU) or a digital signal processor (DSP). However, the data processor 520 is not limited to these examples. In FIG. 7, for ease of description, the data processor 520 and the DRAM 10 are connected via the system bus 510. However, the data processor 520 and the DRAM 10 may be connected to each other via a local bus, instead of the system bus 510.

In addition, for ease of description, FIG. 7 illustrates only a single system bus 510. However, a plurality of system buses 510 may be arranged in serial or parallel via connectors, as needed. In addition, while a storage device 540, an I/O device 550, and a ROM 560 are connected to the system bus 510 in the data processing system 500 of FIG. 7, these devices are not essential components.

Examples of the storage device 540 include a hard disk drive, an optical disk drive, and a flash memory. Examples of the I/O device 550 include a display device such as a liquid crystal display and an input device such as a keyboard and a mouse.

The I/O device 550 may be either an input device or an output device.

In addition, while FIG. 7 illustrates only a single component for each component type for ease of description, the data processing unit is not limited to such example. A plurality of components may be arranged for one or more component types.

In example 2, a controller (data processor 520, for example) controlling the DRAM 10 uses the system clocks CK and CKB and other control signals to issue various types of commands relating to read access to data in the DRAM 10. Upon receiving a read command from the controller, the semiconductor device 10 reads stored information held therein and outputs the data to the system bus 510 via the DQ I/O buffer 25 (FIG. 1). The commands issued by the controller are known commands (system commands) that control semiconductor devices and that are defined by an industry organization (Joint Electron Device Engineering Council (JEDEC) Solid State Technology Association).

In example 2, in addition to the DRAM 10, the storage device 540, the I/O device 550, and the ROM 560 may also use the semiconductor device adopting the multiplexer described in example 1. In response to a request from the data processor, inside each chip, the multiplexer 31 of FIG. 2 can convert data prepared in parallel from parallel data to serial data and transfer the data to the data processor via the output buffer at high speed.

In the above examples, cases where the multiplexer is mainly used to output data read from a memory are described. However, the semiconductor device of the present invention is not limited to such cases. A circuit generating multiphase internal clocks, the latch circuit 21, and the output buffer 35 may be configured arbitrarily. In addition, specific configurations of the switches and the switch control circuits are not limited to those illustrated in FIG. 3. The switches and the switch control circuits may be configured arbitrarily.

The semiconductor device including the multiplexer according to the present invention can be applied to general semiconductor devices, such as a central processing unit (CPU), a micro control unit (MCU), a digital signal processor (DSP), an application specific integrated circuit (ASIC), and an application specific standard circuit (ASSP). Examples of a product form of such semiconductor device according to the present invention include system on chip (SOC), multi-chip package (MCP), and package on package (POP). The present invention can be applied to semiconductor devices having these arbitrary product forms and package forms.

In addition, the transistors used in the present invention are not limited to metal oxide semiconductors (MOSs), as long as the transistors are field-effect transistors (FETs). Various types of FETs are applicable, such as metal-insulator semiconductors (MISs) and thin film transistors (TFTs). In addition, some of the transistors may be bipolar-type transistors. Transistors other than FETs may be used.

A PMOS transistor (P-channel MOS transistor) is a typical example of a first conductivity type transistor, and an NMOS transistor (N-channel MOS transistor) is a typical example of a second conductivity type transistor.

It should be noted that other objects, features and aspects of the present invention will become apparent in the entire disclosure and that modifications may be done without departing the gist and scope of the present invention as disclosed herein and claimed as appended herewith. Also it should be noted that any combination or selection of the disclosed and/or claimed elements, matters and/or items may fall under the modifications aforementioned.

What is claimed is:

1. A semiconductor device comprising:
a multiplexer comprising:
a plurality of switches each including input and output nodes; and
a plurality of switch control circuits each controlling electrical continuity and discontinuity of a corresponding one of the plurality of switches,
wherein output nodes of the plurality of switches are commonly coupled to a first node,
wherein each of the plurality of switch control circuits comprises a detection circuit,
wherein each of the plurality of switch control circuits controls an electrical continuity of the corresponding one of the plurality of switches to conducting in a first cycle in time series, and
wherein each of the plurality of switch control circuits controls the electrical continuity of the corresponding one of the plurality of switches to non-conducting, when a corresponding one of the plurality of detection circuits detects that a data signal at a corresponding one of the input nodes appears at a corresponding one of the output nodes.

2. The semiconductor device according to claim 1,
wherein, irrespective of changes of a data signal at the first node caused when electrical continuity of another one of the switches is established after electrical discontinuity of one switch is established by a corresponding switch control circuit, the corresponding switch control circuit maintains electrical discontinuity of the one switch until the next first cycle relating to the one switch of which electrical discontinuity has been established.

3. The semiconductor device according to claim 1,
wherein the first cycle is a cycle of data signals at input nodes of the plurality of switches, and
wherein, assuming that the number of the plurality of switches is n, a cycle of the data signal at the first node is 1/n of the first cycle.

4. The semiconductor device according to claim 3,
wherein the semiconductor device is supplied with a system clock from the outside of the semiconductor device, and
wherein the first cycle is n/2 of a system clock cycle, and a cycle of a series data signal at the first node is ½ of the system clock cycle.

5. The semiconductor device according to claim 3, further comprising:
a clock generation circuit generating n-phase clock signals each having a phase different by 1/n cycle from adjacent phases and each having the first cycle,
wherein each of the plurality of switches is controlled from an electrically non-conducting state to an electrically conducting state when a corresponding one of the n-phase clock signals is activated.

6. The semiconductor device according to claim 5,
wherein a period during which each of the switches maintains electrical continuity is shorter than a period during which the corresponding one of the clock signals is activated.

7. The semiconductor device according to claim 1,
wherein each of the switches comprises a tri-state buffer including binary logic output states and a high-impedance state.

8. The semiconductor device according to claim 1, further comprising:
an output buffer outputting the data signal at the first node to an external terminal.

9. The semiconductor device according to claim 8,
wherein the output buffer comprises a first and a second input nodes,
wherein each of the plurality of switches comprises a first and a second switches both receiving the data signal inputted to the corresponding input node,
wherein the output buffer comprises: a first output transistor coupled between a first power supply and the external terminal, electrical continuity and electrical discontinuity of the first output transistor being controlled based on a potential at the first input node; and a second output transistor coupled between a second power supply and the external terminal, electrical continuity and electrical discontinuity of the second output transistor being controlled based on a potential at the second input node, and functions as a tri-state buffer including binary logic output states and a high-impedance state, and
wherein output nodes of the plurality of first switches each included in a respective one of the plurality of switches are commonly coupled to the first input node and output nodes of the plurality of second switches each included in a respective one of the plurality of switches are commonly coupled to the second input node.

10. A semiconductor device comprising:
a multiplexer; and
an output buffer,
wherein the multiplexer comprises: n switches (n is an integer of 2 or greater) each including an input node receiving a different data signal and each including an output node coupled to an input node of the output buffer; and a plurality of switch control circuits each corresponding to a respective one of the n switches,
wherein each of the plurality of switch control circuits controls an electrical continuity of a corresponding one of the n switches to conducting and the n switches synchronized with a first cycle and each phase of establishing the electrical continuities of the n switches is different by 1/n of the cycle from adjacent phases,
wherein each of the plurality of switch control circuits controls the electrical continuity of the corresponding one of the plurality of switches to non-conducting when each of the plurality of switch control circuits detects that an output-side data signal of the corresponding output-side of one of the n switches matches an input-side data signal of the corresponding an input-side of one of the n switches,
wherein the multiplexer converts n data that is inputted in parallel to the n switches and that changes in the first cycle into serial data that changes in 1/n of the first cycle, and
wherein the output buffer outputs the serial data from an output node of the output buffer.

11. The semiconductor device according to claim 10, further comprising:
a clock generation circuit generating n-phase clock signals each having a phase different by 1/n cycle from adjacent phases and each having the first cycle,
wherein each of the n switches is controlled from an electrically non-conducting state to an electrically conducting state when a corresponding one of the n-phase clock signals is activated, and
wherein a period during which each of the switches maintains the electrical continuity is shorter than a period during which the corresponding one of the clock signals is activated.

12. The semiconductor device according to claim 10,
wherein, irrespective of changes of the data signal at the input node of the output buffer caused when electrical continuity of another one of the switches is established after electrical discontinuity of one switch is established by the corresponding switch control circuit, the corresponding switch control circuit maintains electrical discontinuity of the one switch until the next first cycle relating to the one switch of which electrical discontinuity has been established.

13. The semiconductor device according to claim 10, further comprising:
a clock generation circuit generating n-phase clock signals each having a phase different by the 1/n cycle from adjacent phases and each having the first cycle,
wherein each of the n clock signals is supplied to a corresponding one of the plurality of switch control circuits,
wherein each of the switch control circuits comprises a set/reset circuit that is set when a corresponding one of the clock signals represents a first logic and that is reset when the matching is detected,
wherein each of the switch control circuits controls the electrical continuity of the corresponding one of the switches to conducting when the corresponding one of the clock signals represents a second logic and when the set/reset circuit is set, and
wherein each of the switch control circuits controls electrical continuity of the corresponding one of the switches to non-conducting when the corresponding one of the clock signals represents a first logic and when the set/reset circuit is reset.

14. The semiconductor device according to claim 10,
wherein each of the n switches comprises a tri-state buffer including binary logic output states and a high-impedance state.

15. The semiconductor device according to claim 14,
wherein the tri-state buffer is a tri-state inversion buffer of which output logic is an inversion of an input logic of the buffer, and
wherein the detection is executed by comparing a logic of the output-side data signal of each of the switches with an inversion logic of the input-side data signal of the switch.

16. The semiconductor device according to claim 10,
wherein the output buffer comprises a first and a second input nodes,
wherein the output buffer is a tri-state output buffer comprising: a first conductivity type output transistor coupled between a first power supply and the output node, electrical continuity and electrical discontinuity of the first conductivity type output transistor being controlled based on a potential at the first input node; and a second conductivity type output transistor coupled between a second power supply and the output node, electrical continuity and electrical discontinuity of the second conductivity type output transistor being controlled based on a potential at the second input node, and including binary logic output states and a high-impedance state,
wherein each of the n switches comprises first and second switches both receiving a corresponding one of the input-side data signals, and
wherein output nodes of the plurality of first switches each included in a respective one of the n switches are commonly coupled to the first input node and output nodes of the plurality of second switches each included in a respective one of the n switches are commonly coupled to the second input node.

17. The semiconductor device according to claim 16,
wherein the switch control circuits are supplied with an output enable signal,
wherein, when the output enable signal is enabled, each of the switch control circuits establishes electrical continuity of the respective first and second switches in the first cycle,
wherein, when each of the switch control circuits detects that output-side data signals of an output-sides of the first and second switches match input-side data signals of an input-sides of the first and second switches, each of the switch control circuits controls electrical continuity of the first and second switches to non-conducting, and
wherein, when the output enable signal is disabled, each of the switch control circuits controls the respective first and second switches so that an output from the output buffer is brought in a high-impedance state.

18. The semiconductor device according to claim 17,
wherein, in the high-impedance control, the first and second switches are controlled so that electrical discontinuity of both the first conductivity type output transistor and the second conductivity type output transistor are established based on potentials at the first and second input nodes.

19. The semiconductor device according to claim 10,
further comprising a data holding circuit coupled to an input node of the output buffer.

20. The semiconductor device according claim 10,
wherein the output node of the output buffer is coupled to an external terminal, and
wherein the output node of the output buffer is an external output buffer outputting the serial data to the external terminal.

21. The semiconductor device according to claim 10, further comprising:
a memory storing a plurality of pieces of information,
wherein a plurality of data, which is the plurality of pieces of information, is read in parallel from the memory and each data is inputted to an input node of each of the switches.

22. The semiconductor device according to claim 10,
wherein the semiconductor device is supplied with a system clock from the outside of the semiconductor device, and
wherein the first cycle is n/2 of a system clock cycle, and a cycle of the serial data outputted from the output buffer is ½ of the system clock cycle.

23. A method for controlling a semiconductor device comprising a multiplexer converting a plurality of data, each of which is inputted in parallel to a respective one of a plurality of switches including a plurality of output nodes connected in wired-OR, into serial data by establishing electrical continuity of the plurality of switches in a time-division manner, the method comprising:
establishing electrical continuity of a first switch of the plurality of switches in synchronization with a time-division signal;
detecting that an output-side data signal of an output-side of the first switch matches an input-side data signal of an input-side of the first switch after electrical continuity of the first switch is established; and breaking electrical continuity of the first switch before electrical continuity of a second switch of the plurality of switches is established by the detection in synchronization with the time-division signal.

24. The method according to claim 23,
wherein, irrespective of changes of the data signal at the nodes connected in wired-OR caused when electrical continuity of the second switch is established after electrical continuity of the first switch is broken, electrical discontinuity of the first switch is maintained until the next electrical continuity control relating to the first switch of which electrical discontinuity has been established.

25. The method according to claim 23,
wherein the plurality of switches are controlled so that each of the plurality of switches establishes electrical continuity in synchronization with an edge of a respective one of a plurality of clocks each having a different phase.

26. The method according to claim 23,
wherein each of the switches is an inversion switch that inverts a logic of the input-side data signal and outputs an inversion logic, and
wherein the detection is executed by comparing a logic of the output-side data signal of the switch with an inversion logic of the input-side data signal of the switch.

27. The method according to claim 23, the semiconductor device comprising a memory and the method further comprising:
causing the memory to read data in parallel in response to a signal supplied from the outside;
causing the multiplexer to convert the data read in parallel from the memory into serial data in the time-division manner; and
causing the semiconductor device to output the data read from the memory and converted into serial data by the multiplexer to the outside.

* * * * *